United States Patent [19]

Krimmel

[11] 4,137,457
[45] Jan. 30, 1979

[54] METHOD OF PRODUCING IMPLANTED AREAS IN A SUBSTRATE

[75] Inventor: Eberhard Krimmel, Pullach, Germany

[73] Assignee: Siemens Aktiengesellschaft, Berlin & Munich, Germany

[21] Appl. No.: 825,248

[22] Filed: Aug. 17, 1977

[30] Foreign Application Priority Data

Sep. 22, 1976 [DE] Fed. Rep. of Germany ....... 2642599

[51] Int. Cl.² .............................................. A61K 27/02
[52] U.S. Cl. .............................. 250/492 A; 250/492 B
[58] Field of Search ............. 250/492 R, 492 A, 492 B

[56] References Cited

U.S. PATENT DOCUMENTS

| 2,741,704 | 4/1956 | Trump et al. | 250/492 B |
| 3,434,894 | 3/1969 | Gale | 250/492 A |
| 3,445,926 | 5/1969 | Medved | 250/492 A |
| 3,761,721 | 9/1973 | Altshuler | 350/3.6 |

*Primary Examiner*—Harold A. Dixon
*Attorney, Agent, or Firm*—Hill, Gross, Simpson, Van Santen, Steadman, Chiara & Simpson

[57] ABSTRACT

Implanted areas are produced on a substrate by irradiating the surface of the substrate with two coherent high kinetic energy beams which are superimposed in relation to one another and spaced from the substrate surface in such a manner that maxima and/or minima of an interference pattern formed by the two particle streams are located on the substrate surface.

1 Claim, 2 Drawing Figures

METHOD OF PRODUCING IMPLANTED AREAS IN A SUBSTRATE

BACKGROUND OF THE INVENTION

1. Field of the Invention

The invention relates to a method of producing implanted areas on a substrate.

2. Prior Art

Some components in a semiconductor technology require a substrate, such as a silicon semiconductor substrate, which has a periodic doping pattern. For example, German Offenegungsschrift No. 2,049,684 discloses a laser diode comprised of a semiconductor having areas or zones of different dopant concentration so that the spacing of such zones is between a 10- multiple and a 500- multiple of the lattice constant of the semiconductor and thus the dopant zone dimensions are in a range of 1 nm to 1 $\mu$m. Known methods of producing such periodic dopant patterns having dimensions above 1 $\mu$m generally utilize photo-lithographic masking techniques. For dopant patterns where the dimensions of an individual dopant area is less than 1 $\mu$m to about 100 nm, electron or ion irradiation techniques are utilized whereby an ion or an electron beam is deflected or focused via an electrooptical means and is guided to select areas on a substrate. However, when dopant areas having a dimension less than about 10 $\mu$m are required, ion-beams are unsuitable for producing such small areas because it is difficult to obtain a high current ion beam having a diameter smaller than 10 $\mu$m. A greater concentration of an ion beam may be achieved with high energy ions, however, such ion beam causes such a large radiation damage in the irradiated substrate that no useful component can be attained from a so-damaged not annealed semiconductor.

SUMMARY OF THE INVENTION

The invention provides a method of producing implanted areas in a substrate whereby the size of the implanted areas and the spacing therebetween can be of a dimension on the order of about 1 nm and whereby such dimensions can be varied by a selective arrangement of the radiation system utilized.

In accordance with the principles of the invention, select size implanted areas, which are selectively spaced from one another, are produced on a substrate surface by irradiating such surface with two coherent high kinetic energy particle beams which are superimposed in relation to one another and arranged relative to the substrate surface so that the maxima and/or minima of an interference pattern formed by such particle streams are located on the substrate surface. In certain embodiments of the invention, the charged particles, such as dopant ions, have a kinetic energy of about 1 to 50 keV and the substrate is a semiconductor. In certain embodiments of the invention, an electrostatic filament biprism is utilized to produce the coherent particle beams from a single particle source.

DESCRIPTION OF THE PREFERRED EMBODIMENTS

Figure 1:
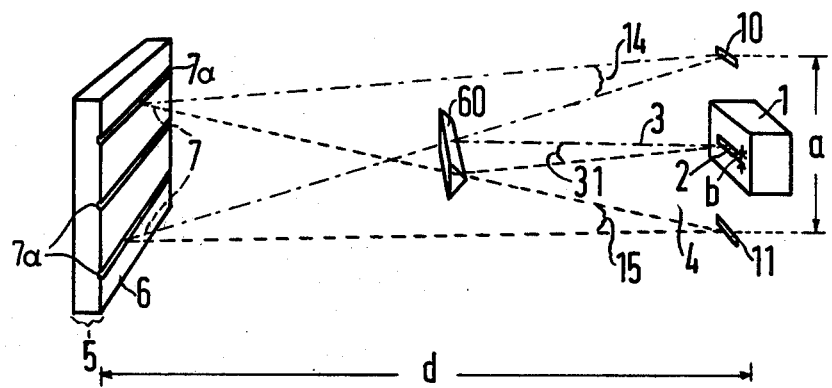
FIG. 1 is an elevated schematic view of a mode of operating in accordance with the principles of the invention.

The invention provides a method of producing extremely fine sized implanted areas in an extremely detailed pattern on a substrate surface.

The invention is based on the fact that particle beams have a dual wave-particle characteristic and thus may be subjected to diffraction and interference phenomena. Such diffraction and interference phenomena occur when a particle beam has an angular coherence defined by the relation:

$$b \times \sin \delta^\circ \lambda/2$$

wherein b is the width of an opening slit of a particle source, $\delta$ is the generated angle of the particle beam and $\lambda$ is the wavelength of such beam. The wavelength, $\lambda$, of a particle beam may be attained from the equation:

$$\lambda = h/(2mE)^{\frac{1}{2}}$$

wherein m is the mass of a particle in the beam, E is the kinetic energy of the beam and h is the Planck constant. Generally, acceleration voltages of about 5 to 10 keV are utilized in ion implantating thin layers and the wavelengths for a particle beam having such kinetic energy has a magnitude of about $10^{-16}$ cm.

In accordance with the principles of the invention, a high kinetic particle beam of accelerating ions is coherently divided, for example, by an electrostatic filament biprism or a biprism formed of a magnetic material, and the so-obtained coherent particle beams are superimposed on one another in such a manner that an interference phenomena occurs. For example, a field of parallelly extending stripe-shaped maxima and minima are formed as the interference pattern. The substrate to be irradiated is then positioned or arranged in such a manner that such an interference pattern of the two particle beams is present or located on the substrate surface so that a periodic concentration distribution of the particles within such beams is implanted in the so-irradiated substrate surface. The spacing of the maxima or minima, respectively, and thus the spacing, $\Delta$, of the concentration maxima or minima of the implanted particles in the substrate is defined by the equation:

$$\Delta = \lambda \times d/a$$

wherein a is the distance between the sources of the coherent particle streams and d is the distance between the substrate surface on which the interference pattern is formed and the plane containing the particle beam sources. With an electrostatic filament biprism, the dimension a, may be varied, for example, by controlling the voltage applied to the filament. In this manner, the invention provides advantageous controls and variations not attainable with prior art techniques.

An additional advantage of the invention is that the means which produces the particle beam pattern (i.e., the maxima and minima concentration distribution of the irradiated particles), may be arranged or positioned at a substantial distance from the substrate being irradiated so that, for example, the substrate surface is less endangered by a careless operation. This is in contrast to other techniques, such as the Channelling method. Further, the particle beam divider means per se, is not subjected to aging or to damage from the particle beams so that the pattern of the particle beam produced by such a means and/or the pattern of implanted areas produced on a substrate is not altered during operation.

Another advantage realized with the practice of the invention is that any surface irregularities on the substrate being irradiated have little, if any, effect on the implantation pattern produced in the substrate. Particle beam divider means, such as an electrostatic filament biprism are relatively economical and are readily produced. Further, the method of the invention is substantially immune to temperature fluctuations.

The principles of the invention may be practiced not only with beams of charged particles, such as ions or electrons, but may also be practiced with neutral atom beams, molecule beams, neutron beams, etc. In a preferred embodiment of the invention, charged particle beams, particularly ion beams, are utilized as a charged particle beam which can be divided by a simple means into two coherent beams or sub-beams (compare, for example, Magazine For Physics, Vol. 158, (1960), page 35 ff).

Referring now to the drawings, an exemplary embodiment of the invention is illustrated for producing a periodic dopant pattern in a silicon substrate so that the concentration maxima of the implanted dopant areas are parallel to one another and are spaced about 10 nm from one another. Since ions impinging on a substrate surface are laterally scattered in the substrate, the energy applied to the irradiated particles is selected so that the penetration depth of the particles in a silicon substrate is only about 5 nm. In the exemplary embodiment here under discussion, implantation is carried out with boron ions (atomic weight 11). The acceleration voltage utilized during this exemplary ion implantation is 10 keV. From the deBroglie wavelength equation, the wavelength of such a particle beam was calculated to be 8.6 $\times 10^{-12}$ cm. An electrostatic filament biprism is utilized as a beam divider means. The overall arrangement is schematically illustrated at FIG. 1. As shown, an ion source 1, for example having an opening slit 2 with a vertical axial dimension, b, produces ions 3. The resulting ion beam 31 is directed toward a substrate 5. A biprism 60 drawn in analogy to lightoptical features is arranged in the beam path so that the ion beam 31 is divided into at least two coherent sub-beams 14 and 15, respectively. The sub-beams 14 and 15 appear to emerge from virtual beam sources 10 and 11. Since the particle sub-beams 14 and 15 are coherent in relation to one another, interference phenomena occur between such sub-beams. The substrate 5, which is preferably connected to ground, is arranged in such a manner that the resulting interference pattern 7 lies on a surface plane 6 of the substrate 5. With a rectangular opening slit 2 and a bi-prism 60 positioned parallel to such opening slit, an interference pattern comprising interference fringes 7a which extend parallel to one another is attained.

If a spacing, Δ, of the fringes 72 is desired which is about 10 nm, then the distance, a, between the virtual beam sources 10 and 11 must be adjusted in accordance with the equation:

$$a = \lambda \times d/\Delta.$$

For example, in the exemplary embodiment here under discussion, the distance, d, between the particle source 1 and the surface of the substrate 5 was adjusted to 300 cm so that when Δ was $10^{-16}$ cm, the distance, a, was 26 μm. The width, b, of the particle emission slit 2 is defined by the equation:

$b \times \sin \delta \leq \lambda/2$ wherein δ is the angle generated by the particle beam. It is also true that:

$$\sin \delta \approx C/d$$

wherein C is the diameter of the area in the substrate to be irradiated and d is the distance between the substrate surface and the plane containing the particle beam source. Thus, when C is selected to be 1 μm, b will be $13 \times 10^{-16}$ cm. Such small slit openings can be obtained from a conventional ion source with the aid of a reduction cylinder or a rotationally symmetrical projection, however, a field ion source may also be utilized. For a dopant concentration of $10^{20}$ particles per cubic centimeter within the individual implanted areas, a total particle concentration of only $10^6$ particles is required for a slit area, such as 7a, having dimensions of $10^{-4} \times 10^{-4}/cm^2$ and a depth (penetration) of $10^{-6}$ cm. This corresponds to an implantation time of 1 second at an implantation current of $10^{-13}$A.

Figure 2:
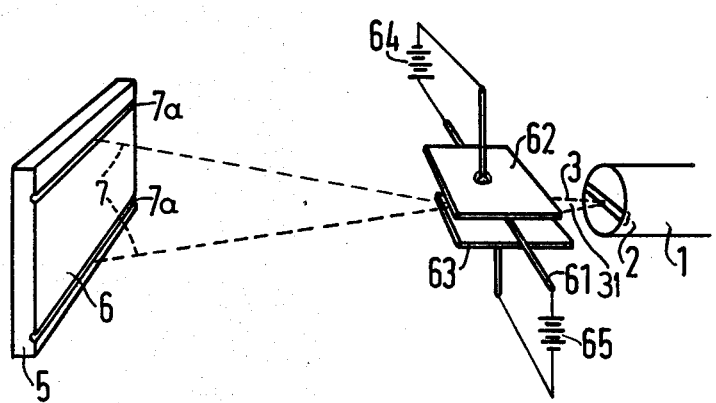
FIG. 2 is a somewhat similar schematic view of a substrate undergoing ion implantation in accordance with the principles of the invention.

FIG. 2 schematically illustrates an apparatus useful in the practice of the invention utilizing an ion source (like reference numerals to those of FIG. 1 are utilized to designate like elements). An ion source 1 is provided in an operational environment with an opening slit 2 so as to produce a stream of ions 3. A particle beam divider means, for example comprised of an electrostatic filament biprism, is positioned to intercept the stream 31 of ions so-produced. Typically an electrostatic filament biprism is comprised of a filament 61 positioned between two electrodes 62 and 63. Controllable voltage sources 64 and 65 are, respectively, operationally connected between the filament 61 and electrodes 62 or 63 so that, for example, filament 61 is biased with a negative potential while the electrodes are biased with a positive potential; preferably, however, the electrodes are biased with a ground potential. In this exemplary embodiment, the thickness of the filament 61 was about 1 μm, the distance between the electrodes 62 and 63 was about 10 mm. The ion beam 31 emerging from the slit 2 is directed toward a substrate 5. The substrate is so-positioned that the interference fringes 7a were produced on the substrate surface 6. The dimensions of the individual interference fringes 7a as well as the distance therebetween can be varied or controlled as desired, by controlling the voltages between filament 61 and electrode 62 and 63 and/or by controlling the acceleration voltage of the ions being irradiated.

As is apparent from the foregoing specification, the present invention is susceptible to being embodied with various alterations and modifications which may differ particularly from those that have been described in the preceding specification and description. For this reason, it is to be fully understood that all the foregoing is intended to be merely illustrative and is not to be construed or interpreted as being restrictive or otherwise limiting of the present invention, excepting as it is said forth and defined in the hereto-appended claims.

I claim as my invention:

1. A method of producing dopant material implanted areas in a semiconductor substrate, comprising:
generating a main beam composed of relatively high kinetic energy dopant material ions;
dividing said main beam into at least two coherent dopant material ion sub-beams which are superposed in relation to one another; and
positioning said semiconductor substrate relative to said sub-beams so that said substrate is irradiated by said sub-beams and so that the maxima and/or minima of an interference pattern formed by said dopant ion sub-beams is located on a surface of said substrate.

* * * * *